United States Patent
Lee et al.

(10) Patent No.: US 12,381,170 B2
(45) Date of Patent: Aug. 5, 2025

(54) TEMPORARY BONDING AND DEBONDING PROCESS TO PREVENT DEFORMATION OF METAL CONNECTION IN THERMOCOMPRESSION BONDING

(71) Applicant: Brewer Science, Inc., Rolla, MO (US)

(72) Inventors: Chia-Hsin Lee, Taoyuan (TW); Alice Guerrero, Overijse (BE); Arthur O. Southard, St. James, MO (US); Chen-Yu Wu, Taipei (TW); Xiao Liu, Chandler, AZ (US)

(73) Assignee: Brewer Science, Inc., Rolla, MO (US)

( * ) Notice: Subject to any disclaimer, the term of this patent is extended or adjusted under 35 U.S.C. 154(b) by 368 days.

(21) Appl. No.: 17/672,020

(22) Filed: Feb. 15, 2022

(65) Prior Publication Data

US 2022/0262755 A1 Aug. 18, 2022

Related U.S. Application Data

(60) Provisional application No. 63/149,535, filed on Feb. 15, 2021.

(51) Int. Cl.
*H01L 23/00* (2006.01)
(52) U.S. Cl.
CPC .............. *H01L 24/11* (2013.01); *H01L 24/13* (2013.01); *H01L 2224/11003* (2013.01);
(Continued)
(58) Field of Classification Search
CPC ...................................................... H01L 24/11
See application file for complete search history.

(56) References Cited

U.S. PATENT DOCUMENTS 7,713,835 B2  5/2010  Pillalamarri
7,935,780 B2  5/2011  Hong et al.
(Continued)

OTHER PUBLICATIONS

International Search Report and Written Opinion mailed May 30, 2022 in corresponding PCT/US2022/016459 filed Feb. 15, 2022, 11 pages.

(Continued)

*Primary Examiner* — William A Harriston
(74) *Attorney, Agent, or Firm* — HOVEY WILLIAMS LLP

(57) ABSTRACT

Achieving homogeneous and heterogeneous integration for 2.5D and 3D integrated circuit, chip-to-wafer, chip-to-substrate, or wafer-to-wafer bonding is an essential technology. The landing wafer or substrate is bonded with a carrier by using a temporary bonding material before thinning the landing wafer to the desired thickness. Upon completion of redistribution layer formation, Cu pad formation, or other backside processing, dies or wafers with through-silicon vias are stacked onto the landing substrate before molding and singulation. As the landing wafer usually has interconnection metals in the bond line, and those interconnection metals are typically made from lead-free solder alloys, deformation of those solder alloys during thermocompression bonding becomes an issue for manufacturers. To address this issue, a polymeric material with desired strengths is coated on the device wafer to form a conformal protective layer on top of solder alloys, thus enabling temporary bonding and debonding processes.

40 Claims, 10 Drawing Sheets

(52) U.S. Cl.
    CPC ............... *H01L 2224/11602* (2013.01); *H01L 2224/1357* (2013.01); *H01L 2224/1369* (2013.01); *H01L 2924/1511* (2013.01); *H01L 2924/15311* (2013.01)

(56) References Cited

U.S. PATENT DOCUMENTS

| | | |
|---|---|---|
| 8,092,628 B2 | 1/2012 | Hong et al. |
| 8,268,449 B2 | 9/2012 | Moore et al. |
| 9,496,164 B2 | 11/2016 | Bai et al. |
| 10,103,048 B2 | 10/2018 | Flaim et al. |
| 10,968,348 B2 | 4/2021 | Liu et al. |
| 2008/0110530 A1 | 5/2008 | Wilson et al. |
| 2009/0233120 A1 | 9/2009 | Maruyama et al. |
| 2014/0213039 A1* | 7/2014 | Lee .................. H01L 21/6835 156/247 |
| 2015/0035140 A1* | 2/2015 | Agarwal ............ H01L 21/6835 257/737 |
| 2019/0194453 A1* | 6/2019 | Liu ...................... B32B 27/285 |
| 2020/0234993 A1 | 7/2020 | Prenger et al. |
| 2021/0033975 A1 | 2/2021 | Sejoubsari et al. |

OTHER PUBLICATIONS

Electrolube, Let's Talk Solutions [online], "Conformal Coating of Printed Circuit Boards," originally published: Nov. 1, 2009, retrieved from <https://electrolube.com/knowledge_base/conformal-coating-of-printed-circuit-boards/>, date of the snapshot stored in the Internet archive: Feb. 14, 2020, pp. 1-2.

* cited by examiner

TEMPORARY BONDING AND DEBONDING PROCESS TO PREVENT DEFORMATION OF METAL CONNECTION IN THERMOCOMPRESSION BONDING

RELATED APPLICATIONS

The present application claims the priority benefit of U.S. Provisional Patent Application Ser. No. 63/149,535, filed Feb. 15, 2021, entitled TEMPORARY BONDING AND DEBONDING PROCESS TO PREVENT DEFORMATION OF METAL CONNECTION IN THERMOCOMPRESSION BONDING, incorporated by reference in its entirety herein.

BACKGROUND

Field

This invention relates to temporary bonding materials and methods, namely during semiconductor and microelectronics fabrication.

DESCRIPTION OF RELATED ART

Temporary wafer bonding ("TWB") normally refers to a process for attaching a device wafer or microelectronic substrate to a carrier wafer or substrate by means of a polymeric bonding material. After bonding, the device wafer is thinned (typically to less than 50 μm) and then processed to create through-silicon vias ("TSV"), redistribution layers, bond pads, and other circuit features on its backside. The carrier wafer supports the fragile device wafer during the backside processing, which can entail repeated cycling between ambient and high temperatures (>250° C.), mechanical shocks from wafer handling and transfer steps, and strong mechanical forces, such as those imposed during wafer back-grinding processes used to thin the device wafer. When all of the backside processing has been completed, the device wafer is usually attached to a film frame and then separated, or debonded, from the carrier wafer and cleaned before further operations take place.

Most TWB processes use either one or two layers between the device wafer and the carrier wafer. In the case of a two-layer system, each layer tends to be relatively thick compared to the substrates and/or feature sizes. The first layer is a planar (i.e., it covers any features/topography present so as to create a planar or flat bonding surface, free of topography) polymeric bonding material. It can be thermoplastic, thermosetting, or photocuring in nature. The second layer, which may or may not be polymeric in nature, is also planar and allows the bonded wafer pair to be separated by applying low mechanical force to delaminate the structure at the interface between the two layers. In some instances, the second layer responds to radiation from a laser or other light source, causing bonding integrity to be lost within the structure and allowing the wafers to come apart by applying little or no mechanical force.

In some TWB processes, the front surface of the device wafer contains solder balls. During typical thermocompression bonding processes, the combination of pressure and heat during bonding can cause the solder balls to deform and/or shift, resulting in misalignment and other processing difficulties when trying to make connections via the solder balls after backside processing. Due to the high downward force from the bond head on chip to the landing wafer at high temperatures, the failure mode results in decreased bump height and/or ball shift. There is a need for thermocompression bonding methods that do not cause solder balls to deform and/or shift during bonding.

SUMMARY

The present disclosure is broadly concerned with a temporary method comprising providing a stack that comprises a first substrate, a conformal layer of a composition, a second substrate, and a bonding layer. The first substrate has a back surface and a front surface, with the front surface comprising a solder ball. The conformal layer of the composition is on the front surface and the solder ball. The second substrate has a first surface, and the bonding layer is on that first surface and in contact with the conformal layer. The first and second substrates are separated.

The disclosure also provides a microelectronic structure comprising a first substrate, a conformal layer of a thermoplastic composition, a bonding layer, and a second substrate. The first substrate has a back surface and a front surface, with the front surface comprising a solder ball. The conformal layer of the thermoplastic composition is on the front surface and the solder ball. The bonding layer is in contact with the conformal layer. The second substrate has a first surface, and the bonding layer is adjacent that first surface.

In a further embodiment, the disclosure provides a bonding method comprising forming a conformal layer of a thermoplastic composition on a front surface of a first substrate to form a conformally coated first substrate, where the front surface comprises a solder ball. The conformally coated first substrate is bonded to a second substrate having a first surface with a bonding layer on said first surface by contacting the bonding layer and the conformal layer.

DETAILED DESCRIPTION

The present disclosure addresses the industry needs by providing a method that avoids shifting and/or deformation of solder balls during thermocompression bonding.

Figure 1:
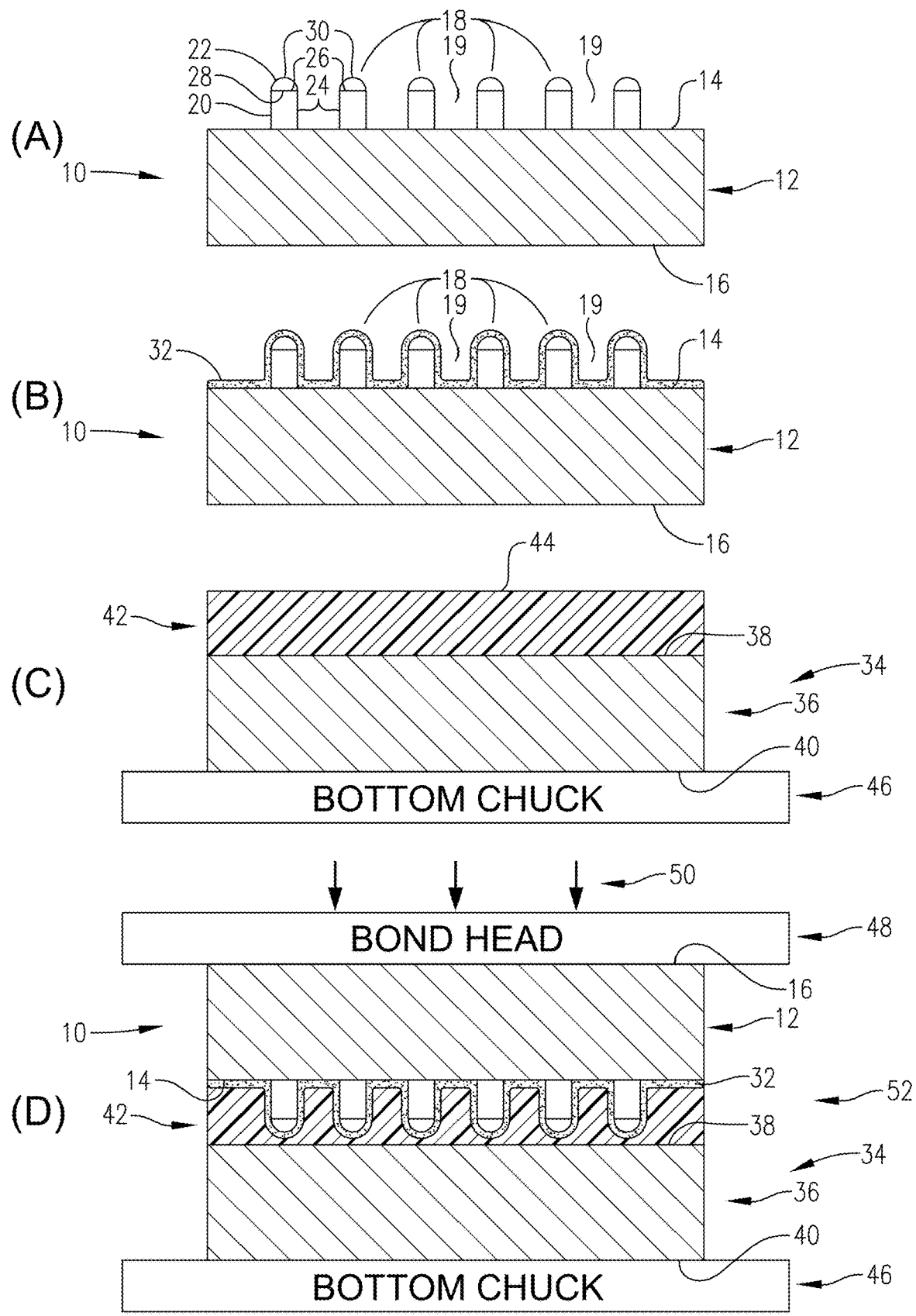
FIG. 1 is a schematic (not to scale) depiction of a bonding method embodiment that avoids solder ball shifting and/or deformation.

In more detail and referring to FIG. 1(A) (not to scale), a precursor structure 10 is depicted in a schematic and cross-sectional view. Structure 10 includes a first substrate 12, which has a front surface 14 and a back surface 16. Although substrate 12 can be of any shape, it would typically be circular, rectangular, or oblong in shape. In one embodiment, substrate 12 can be a silicon or glass wafer, such as a glass panel substrate that would be used in chip-to-substrate applications. In another embodiment, substrate 12 is a device wafer, and front surface 14 is preferably a device surface that includes a plurality of features 18 and areas 19 therebetween. While the illustrated embodiment only depicts features 18, it will be appreciated that device surfaces can comprise an array of devices such as those chosen from integrated circuits, MEMS, microsensors, power semiconductors, light-emitting diodes, photonic circuits, interposers, embedded passive devices, and/or other microdevices fabricated on or from silicon and other semiconducting materials such as silicon-germanium, gallium arsenide, gallium nitride, aluminum gallium arsenide, aluminum indium gallium phosphide, and indium gallium phosphide. These device surfaces may commonly comprise structures formed from one or more of the following materials: silicon, polysilicon, silicon dioxide, silicon (oxy)nitride, metals (e.g., copper, aluminum, gold, tungsten, tantalum), low k dielectrics, polymer dielectrics, and various metal nitrides and silicides. Such device surfaces can also include structures chosen from one or more of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

Figure 2:
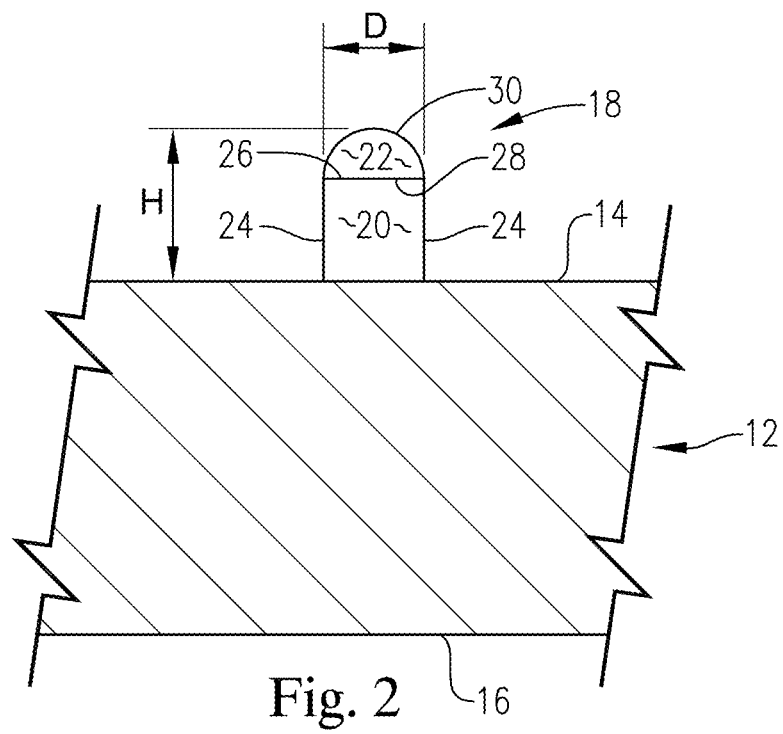
FIG. 2 is a fragmentary view with one of the features of FIG. 1, enlarged to show additional detail.

In the embodiment illustrated, features 18 each comprise a metal pillar 20 and a solder bump or ball 22. FIG. 2 depicts an enlarged view of a feature 18. Each metal pillar 20 extends from upper surface 14 and has respective sidewalls 24 and respective upper surfaces 26. Respective solder balls 22 are positioned on upper surfaces 26. Each solder ball 22 has a contact surface 28 that is in contact with metal pillar upper surface 26. Additionally, each solder ball 22 has a curved outer surface 30 (an "upper" curved surface in the embodiment depicted) that is not in contact with upper surface 26. Metal pillars 20 can be formed of any conventionally used material, including copper, gold, and/or aluminum.

It will be appreciated that solder bumps or balls 22 can be made of any number of materials, depending upon the particular application, design, and other needs. Bumps (e.g., half-spheres on top of a pillar) or balls 22 will typically comprises one or more metals or metal alloys. For example, the bumps or balls 22 may be formed from one or more of Sn, Ag, Ni, Cu, Ti, W, Au, Pb, Bi, Zn, Cd, or In, in alloy or non-alloy form. Typical alloys that are used include those chosen from one or more of SnAg, SnPb, SnInAg, or AuSn. In some instances, solder bumps or balls can comprise a core of a first material (e.g., polymeric, metal, metal alloy) and one or more layers of the same or different metals and/or metal alloys surrounding the core.

The solder bumps or balls 22 can have a wide range of sizes, depending on the particular application and end-use needs but typical dimensions are about 10 μm to about 120 μm, preferably about 20 μm to about 90 μm and more preferably about 30 μm to about 50 μm. These dimensions can refer to either the diameter of the solder ball prior to use (i.e., "as-purchased) or to the maximum surface-to-surface dimension presented by the solder ball or bump after application. "D" in FIG. 2 shows the maximum dimension of solder bump 22 of the illustrated embodiment, while "H" refers to the combined total of the solder ball 22 height and the pillar 20 height.

Referring to FIG. 1(B), a protective composition is applied to front surface 14 of substrate 12 to form a conformal layer 32. The protective composition is preferably a flowable composition that is chosen from various commercially available compositions that possess the properties described herein. Typical such compositions are preferably organic and will comprise a polymer(s) and/or oligomer(s) preferably dissolved or dispersed in a solvent system.

The protective composition is preferably a thermoplastic composition. That is, it is preferred that none of the components in the composition are crosslinkable. In one embodiment, the protective composition is essentially free of crosslinking agents. That is, it comprises less than about 0.5%, preferably less than about 0.1%, and more preferably about 0% by weight crosslinking agent, based on the total weight of the composition taken as 100% by weight.

The polymers or oligomers are typically selected from the group consisting of polymers, copolymers (including block copolymers), and oligomers of one or more of cyclic olefins (e.g., cyclic olefin copolymers ("COCs"), cyclic olefin polymers ("COPs")), epoxies, or siloxanes. Typical polymers also include those chosen from one or more of polyamides, polyimides, polysulfones, polyethersulfones, polyolefins, polyamide esters, polyimide esters, polyetheretherketones, or polyetherimides.

Suitable polymers and/or oligomers have a weight average molecular weight of about 300 Daltons to about 100,000 Daltons, preferably about 500 Daltons to about 50,000 Daltons, and more preferably about 2,000 Daltons to about 20,000 Daltons. The $M_w/M_n$ (polydispersity, or PDI) is preferably from about 1.5 to about 2.5, more preferably about 1.7 to about 2.3, and even more preferably about 1.7 to about 2.3.

The solvent system can comprise organic, inorganic solvents, and/or water. Typical solids contents of the compositions will range from about 1% to about 60% by weight, and preferably from about 3% to about 40% by weight, based upon the total weight of the composition taken as 100% by weight, with the balance of the composition being solvent(s).

The protective composition comprises oligomer(s) and/or polymer(s) that have respective glass transition temperatures ($T_g$) that are higher (and preferably at least about 5° C. higher, more preferably at least about 30° C. higher, and even more preferably at least about 50° C. higher) than the temperature that will be used during bonding (discussed further below). In one embodiment, the oligomer(s) and/or polymer(s) in the protective composition will have respective $T_g$'s that are at least about 200° C., more preferably about 250° C. to about 500° C., even more preferably about 300° C. to about 400° C., and most preferably about 300° C. to about 350° C. $T_g$ is determined by differential scanning calorimetry.

Furthermore, the protective composition preferably has a storage modulus of at least about 0.5 GPa, preferably at least about 1 Gpa, and more preferably at least about 2 Gpa at a temperature of about 250° C. The storage modulus is determined by dynamic measurement at 1 Hz oscillation frequency in temperature ramp.

Some suitable compositions for use in forming conformal layer 32 are described in U.S. Pat. Nos. 8,268,449, 7,935,780, and 8,092,628, each incorporated by reference herein.

Regardless of the protective composition chosen, it can be applied by any known application method, such as spin-coating, slot die coating, or spray coating. A preferred method involves spin-coating the composition at speeds of about 500 rpm to about 3,000 rpm, and preferably about 1,000 rpm to about 1,500 rpm, for a time period of about 20 seconds to about 60 seconds, and preferably about 30 seconds to about 40 seconds. Alternatively, the composition can be applied by other methods including spray coating, jetting, or screen printing. After the composition is applied, it is preferably heated to a temperature of about 40° C. to about 250° C., and more preferably about 60° C. to about 220° C., for time periods of about 1 second to about 6 minutes, and more preferably about 60 seconds to about 4 minutes, thus forming conformal layer 32. In some embodiments, it is preferable to subject the layer to a multi-stage bake process, depending upon the composition utilized. Regardless, it is preferred that the conformal layer 32 undergoes no crosslinking during this process.

The formed conformal layer 32 preferably has a softening point, as determined by inspecting the inflection point in a thermogravimetric analysis spectrum, that is at least about 200° C., preferably from about 220° C. to about 400° C., and more preferably from about 250° C. to about 350° C. Additionally, the formed conformal layer 32 will have a $T_g$ that is higher (and preferably at least about 5° C. higher, more preferably at least about 30° C. higher, and even more preferably at least about 50° C. higher) than the temperature that will be used during bonding (discussed further below). In one embodiment, the formed conformal layer 32 will have a $T_g$ of at least about 200° C., more preferably about 250° C. to about 500° C., even more preferably about 300° C. to about 400° C., and most preferably about 300° C. to about 350° C. Furthermore, the formed conformal layer 32 preferably has a storage modulus of at least about 0.5 GPa, preferably at least about 1 GPa, and more preferably at least about 2 GPa at a temperature of about 250° C. Additionally, and as illustrated in FIG. 1(B), conformal layer 32 forms a continuous, hard coating on front surface 14 of first substrate 12 (including at the areas 19, which are free of features 18 and/or solder balls 22), sidewalls 24 of metal pillars 20, and curved surfaces 30 of solder balls 22, preferably with no intervening layer or other material between conformal layer 32 and surface 14, sidewalls 24, or curved surfaces 30.

Conformal is broadly intended to refer to the fact that layer 32 generally follows the underlying topography (i.e., it does not planarize over the features/topography to create a planar surface). There can be a large degree of thickness variation in a layer that is still considered conformal, provided that this layer does not create a planar or flat surface (i.e., it does not remove surface topologies) but instead generally follows the contour of that topography.

The degree of thickness variation will vary, depending on the embodiment. In one embodiment, conformal layer 32 may have an average thickness (measured at five locations) of about 0.1 µm to about 20 µm, 0.2 µm to about 10 µm, and preferably about 0.5 µm to about 5 µm. Thicknesses as used herein can be measured using any film thickness measurement tool, with one preferred tool being an infrared interferometer, such as those sold by SUSS Microtec or Foothill.

Figure 3:
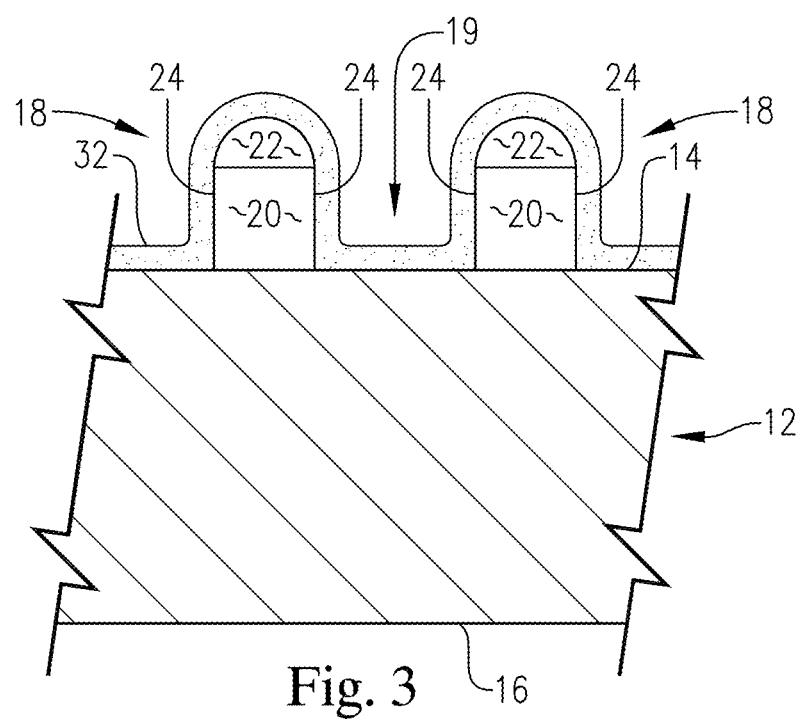
FIG. 3 is a fragmentary view with two of the features of FIG. 1, enlarged to show additional detail.

In one embodiment, conformal layer 32 may have a substantially uniform thickness on and across areas 19 of surface 14 as well as on and across sidewalls 24 and curved surfaces 30 of features 18, as schematically depicted in FIG. 3, thus "conforming" to the underlying topography. That is, in this embodiment the conformal layer 32 preferably has a relatively low total thickness variation ("TTV"), meaning that the thickest and thinnest points of the conformal layer 32 are not dramatically different from one another. Preferably, the TTV of conformal layer 32 is less than about 90% of the total average thickness, more preferably less than about 60% of the total average thickness, even more preferably less than about 40% of the total average thickness, and most preferably less than about 20% of the total average thickness. That is, if the average thickness of the bonded stack is about 10 µm, a TTV of less than about 20% will be about 2 µm.

TTV is preferably calculated by measuring the thickness at a number of points or locations on conformal layer 32, preferably at about 50 points, more preferably at about 100 points, and even more preferably at about 1,000 points. The difference between the highest and lowest thickness measurements obtained at these points is designated the TTV measurement for that particular conformal layer 32. In some TTV measurement instances, edge exclusion or outliers may be removed from the calculation. In those cases, the number of included measurements is indicated by a percentage, that is, if a TTV is given at 97% inclusion, then 3% of the highest and lowest measurements are excluded, with the 3% split equally between the highest and lowest (i.e., 1.5% each). Preferably, the TTV ranges noted above are achieved using from about 95% to about 100% of the measurements, more preferably from about 97% to about 100% of the measurements, and even more preferably about 100% of the measurements.

In one embodiment, conformal layer 32 is still conformal in that it generally follows the underlying topography (i.e., it does not planarize over the features/topography to create a planar surface), but the TTV of conformal layer 32 is much more relaxed than the previously described embodiment. However, in spite of being relaxed, conformal layer 32 is not a planarizing layer. In these instances, the conformal layer 32 can have a thickness at its thickest point that is about 2 to about 15 times, preferably about 2 to about 10 times, and more preferably about 3 to about 8 times thicker than conformal layer 32's thickness at its thinnest point. In these embodiment, the thicker portions of conformal layer 32 are generally found in areas 19 (i.e., areas between pillars, solder bumps, and/or other features or structures), while the thinner portions are generally found on the top and/or sides of the pillars, solder bumps, and/or other features (e.g., on curved surfaces 30 and/or on sidewalls 24).

Regardless of the embodiment, conformal layer 32 is preferably continuous across its entirety. That is, it is preferred that all of conformal layer 32 continues across the features/topography uninterrupted (i.e., no "breaks" in the coating of conformal layer 32), as shown in the accompanying Figures.

Referring to FIG. 1(C), a second precursor structure 34 is depicted, also in a schematic and cross-sectional view. Second precursor structure 34 includes a second substrate 36. In this embodiment, second substrate 36 is a carrier wafer and has a first or carrier surface 38 and a back surface 40. Although second substrate 36 can be any shape, it would typically be circular in shape and sized similarly to first substrate 12. In embodiments where second substrate 36 is a carrier wafer, preferred such carrier wafers include silicon, sapphire, quartz, metals (e.g., aluminum, copper, steel), or various glasses and ceramics substrates/wafers. Suitable carriers preferably have a similar coefficient of thermal expansion (CTE) to the first substrate 12.

First surface 38 of second substrate 36 includes a bonding layer 42 formed thereon. Bonding layer 42 has a bonding surface 44 remote from second substrate 36. Preferably, bonding layer 42 is formed directly on the front surface 38 (i.e., without any intermediate layers between the bonding layer 42 and second substrate 36).

Bonding layer 42 can be formed from any conventional bonding composition using typical application methods, with the composition's formulation and application method depending upon whether the bonding layer is thermoplastic or thermosetting.

1. Thermoplastic Bonding Layer 42

When a thermoplastic bonding composition is used to form bonding layer 42, one preferred method involves spin coating the bonding composition at speeds of about 300 rpm to about 3,000 rpm, and preferably about 750 rpm to about 1,500 rpm, for a time period of about 30 seconds to about 240 seconds, and preferably about 60 seconds to about 180 seconds. Alternatively, the composition can be applied by other methods including laminating, spray coating, jetting, or screen printing. The applied composition is then preferably heated to a temperature of about 50° C. to about 250° C., and more preferably about 60° C. to about 200° C., for time periods of about 1 second to about 6 minutes, and preferably about 60 seconds to about 4 minutes. In some embodiments, it is preferable to subject the layer to a multi-stage bake process, depending upon the composition utilized. Formed thermoplastic bonding layer 42 has a softening point that is at least about −50° C., preferably from about −20° C. to about 100° C., and more preferably from about 0° C. to about 50° C. The thickness of formed thermoplastic bonding layer 42 is preferably about 5 μm to about 200 μm, and more preferably about 10 μm to about 120 μm.

Thermoplastic bonding layer 42 can be formed from any commercially available bonding composition that would be capable of being formed into layers possessing the above properties. Typical such compositions are organic and will comprise a polymer(s) and/or oligomer(s) preferably dissolved or dispersed in a solvent system. The solvent system can include one or more solvents that are organic, inorganic, solvents, or water. The polymers or oligomers are typically selected from the group consisting of polymers, copolymers (including block copolymers), and oligomers of one or more of cyclic olefins (e.g., cyclic olefin copolymers ("COCs"), cyclic olefin polymers ("COPs")), epoxies, acrylics, siloxanes, styrenics, vinyl halides, or vinyl esters. Typical polymers also include those chosen from one or more of polyamides, polyimides, polysulfones, polyethersulfones, polyolefins, polyisoprenes, polyurethanes, polyamide esters, polyimide esters, or polyacetals.

Typical solids contents of the thermoplastic bonding compositions will range from about 1% to about 60% by weight, and preferably from about 3% to about 40% by weight, based upon the total weight of the composition taken as 100% by weight. Some suitable compositions include any thermoplastic compositions described in U.S. Pat. Nos. 9,496,164, 10,103,048, and 10,968,348, each incorporated by reference herein. Finally, thermoplastic bonding compositions used to form bonding layer 42 preferably possess a storage modulus of less than about 1 GPa, more preferably less than about 100 MPa, and even more preferably less than about 10 MPa at a temperature of about 250° C.

2. Thermosetting Bonding Layer 42

When a thermosetting bonding composition is used to form bonding layer 42, one preferred method involves spin coating the bonding composition at speeds of about 300 rpm to about 5,000 rpm, and preferably about 500 rpm to about 2,000 rpm, for a time period of about 30 seconds to about 240 seconds, and preferably about 60 seconds to about 180 seconds. Alternatively, the composition can be applied by other methods including laminating, spray coating, jetting, or screen printing. After the composition is applied, it is preferably heated to a temperature of about 60° C. to about 200° C., and more preferably about 80° C. to about 150° C., for time periods of about 60 seconds to about 3 minutes, and preferably about 90 seconds to about 2 minutes. In some embodiments, it is preferable to subject the layer to a multi-stage bake process, depending upon the composition utilized. This bake should not be at a temperature high enough to initiate curing of the material. Thermosetting bonding layers 42 have a softening point that is at least about 40° C., preferably about 50° C. to about 200° C., and more preferably about 60° C. to about 150° C. The thickness of formed thermosetting bonding layer 42 is preferably about 5 μm to about 200 μm, more preferably about 10 μm to about 120 μm and, most preferably about 20 μm to about 60 μm.

Preferred bonding compositions for use in this embodiment can be chemically crosslinked by heat, light, or other means. That is, these composition include photo- and thermally-curable resin- and polymer-containing compositions, and preferably the types that produce little or no volatile by-products when cured. These include resin and polymer compositions containing at least two reactive epoxy, acrylate, benzoxazine, maleimide, benzocyclobutene, and/or cyanate ester moieties. The reactive moieties can also include chalcone, stilbene, and/or other photodimerizable functional groups. Epoxy resin-containing compositions that are cured with the aid of a photoacid generator ("PAG") or thermal acid generator ("TAG") are especially useful for practicing this embodiment. The process for applying and drying the thermosetting composition prior to the bonding process should minimize, and preferably avoid, causing the composition to crosslink, so that it will remain flowable during the bonding process and allow a void-free bond line to be formed. Some suitable compositions include any thermosetting compositions described in U.S. Patent Application Publication Nos. 2020/0234993 and 2021/0033975, and U.S. Pat. Nos. 9,496,164, 10,103,048, and 10,968,348 each incorporated by reference herein.

3. Bonding Process

Referring to FIG. 1(D), precursor structure 10 is supported on a bottom chuck 46, while a bond head 48 applies a downward pressure 50 against back surface 16 of first substrate 12, causing structures 10 and 34 to be pressed together in a face-to-face relationship. Thus, bonding surface 44 of bonding layer 42 is in contact with front surface 14 (including areas 19 and features 18) of first substrate 12. While pressing, sufficient pressure and heat are applied for a sufficient amount of time so as to effect bonding of the two structures 10 and 34 together to form a bonded stack 52. Conformal layer 32 and bonding layer 42 should be capable of forming a strong adhesive bond with the first substrate 12 and second substrate 36, respectively. Additionally, a continuous, void-free bonding interface should be formed between conformal layer 32 and bonding layer 42. This can be achieved by the selection of compositions used to form conformal layer 32, bonding layer 42, or both.

The bonding parameters will vary depending upon the type of composition from which bonding layer 42 is formed, but typical bonding temperatures will range from about 25° C. to about 200° C., and preferably from about 25° C. to about 100° C., with typical pressures ranging from no pressure (i.e., simply using gravity bonding with no additional force being applied by the bonder), to pressure being applied by the bonder at levels of about 1 N to about 5,000 N, and preferably about 100 N to about 3,000 N, for a time period of about 10 seconds to about 10 minutes, and more preferably about 1 minutes to about 3 minutes. When bonding layer 42 is formed from a thermosetting composition, the bonding pressure and temperature may be reduced to compensate for the high flow of that composition before it cures. The thermosetting bonding composition may begin to cure during the bonding process depending upon the bonding temperature and time that is applied. A post-bond curing bake can be applied to complete the curing process of bonding layer 42, if needed. The post-bond curing bake is typically conducted at about 100° C. to about 250° C., and preferably from about 150° C. to 200° C. for about 1 second to about 60 minutes, and more preferably for about 5 minutes to about 30 minutes.

At this stage, the first substrate can be safely handled and subjected to further processes that might otherwise have damaged the front surface 14 and/or features 18 of the first substrate 12 were it not bonded to second substrate 36. Thus, the structure 10 (as part of stack 52) can now safely be subjected to backside processing such as back-grinding, redistribution layer (RDL) formation, pad formation, chemical-mechanical polishing ("CMP"), etching, metallizing, dielectric deposition, patterning (e.g., photolithography, via etching), passivation, and/or annealing, without separation of substrates 12 and 36 occurring, and without infiltration of any chemistries encountered during these subsequent processing steps. Not only can conformal layer 32 and bonding layer 42 survive these processes, they can also survive processing temperatures up to about 400° C., preferably from about 25° C. to about 350° C., and more preferably from about 100° C. to about 300° C.

Figure 4:
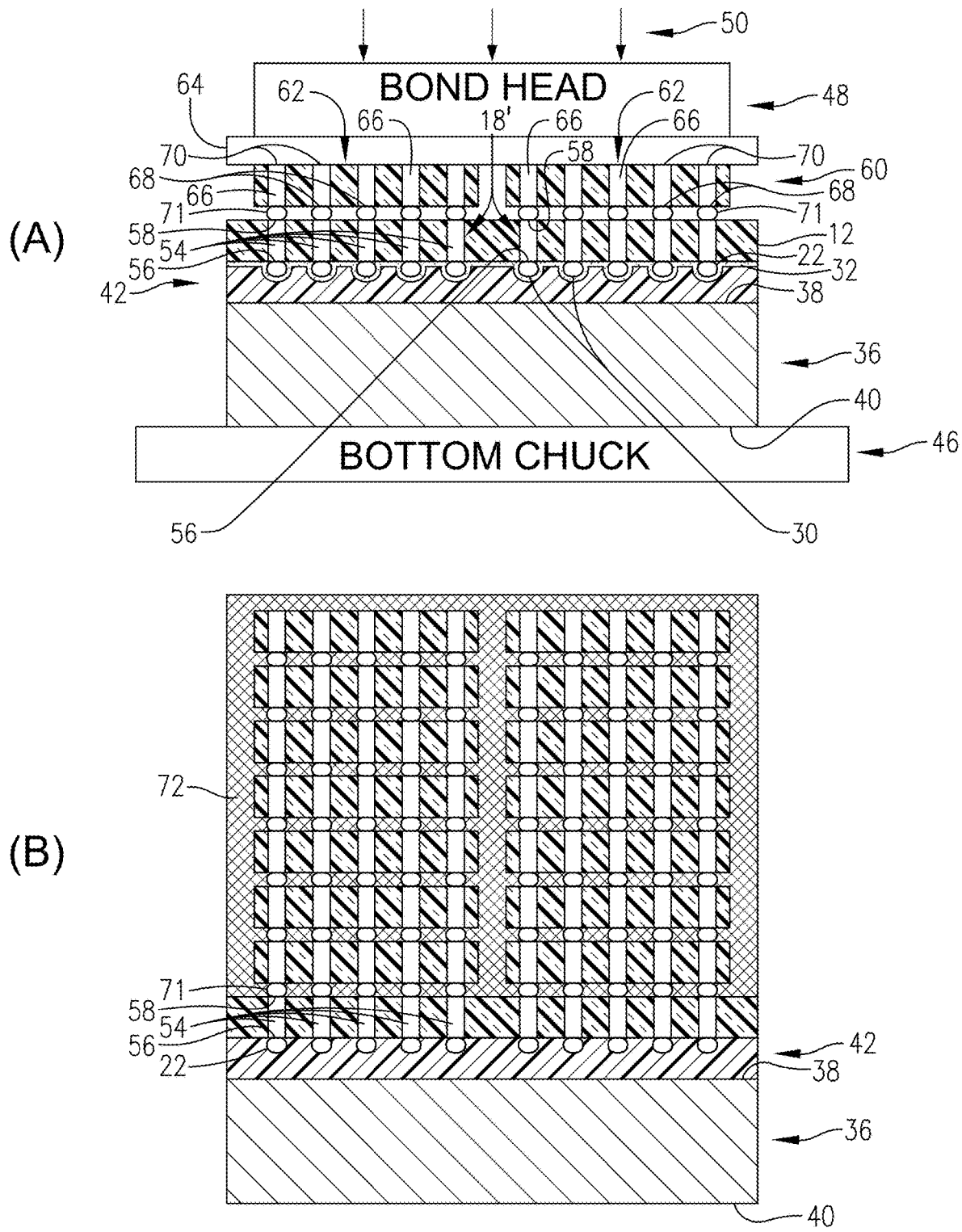
FIG. 4 is a schematic (not to scale) depiction of two alternative embodiments of the disclosed method.

The above backside processing involved wafer-to-wafer bonding. In an alternative embodiment, the disclosed concept can be applied to chip-to-wafer bonding as well as chip stacking. Referring to FIG. 4, where like numbers represent like parts, the process described with respect to FIG. 1 can be repeated, but with the features 18 of first substrate 12 instead comprising through-silicon vias ("TSVs") 54. TSVs 54 have first and second ends 56, 58 and are typically a metal, such as those described above with respect to pillars 20. Furthermore, solder bumps or balls 22 of first substrate 12 (i.e., "under" conformal layer 32) are present and in contact with TSVs 54 at first end 56. In this embodiment, first substrate 12 has undergone backside thinning and is now acting as a landing wafer to which chips can be bonded.

Next, a chip structure 60 comprising one or more chips 62 (two such chips 62 are shown in FIG. 4(A)) supported on a carrier substrate 64 is introduced into the process. Chips 62 also include respective TSVs 66 with first and second ends 68, 70 and solder balls 71 at first end 68. Chip structure 60 is positioned such that its solder balls 71 that are attached to TSVs 66 of chip structure 60 align and contact the second ends 58 of TSVs 54, thus completing the connection. Bond head 48 applies heat and pressure to the chip structure 60 through carrier substrate 64 following the conditions described previously. Alternatively, the following parameters can be used: bonding head temperature less than about 150° C. or about 100° C.; bonding time about 1 second; bonding force about 10 N; and bottom chuck temperature about 80° C.

At this stage, molding material can be applied for protection according to conventional application methods, and the resulting structure can be processed as needed for the particular end use. Alternatively, instead of applying molding material at this stage, multiple such chip structures 60 (e.g., four, eight, twelve) can be stacked successfully as described above and before applying the molding material (see FIG. 4(B)). Additionally, each such chip structure could be the same, different, and/or chiplets. In this instance, ideally a post-bond step is applied after the last chip structure 60 has been attached. Post-bonding conditions are typically a bond head temperature of about 260° C. to about 400° C., a bond force of about 20 N to about 50 N, a bond time of less than about 10 seconds, and a bottom chuck temperature about 150° C. or greater.

Once processing is complete, the substrates 12 and 36 can be separated by any number of separation methods known to be appropriate for the particular bonding composition used to form bonding layer 42. Regardless of which means is utilized, a low mechanical force (e.g., finger pressure, gentle wedging) can then be applied to completely separate the substrates 12 and 36. After separation, any remaining conformal layer 32 can be removed from the front surface 14 of substrate 12 with a solvent capable of dissolving the particular material of which conformal layer 32 is formed. Similarly, bonding layer 42 may be removed from the first surface 38 of second substrate 36 with a solvent capable of dissolving the particular material of which bonding layer 42 is formed, thus enabling reuse of second substrate 36.

Advantageously, regardless of the foregoing method, the conformal layer 32 decreases or even completely prevents the solder balls 22, copper pillars, and other devices or structures on the substrate 12 and covered by conformal layer 32 from deforming, shifting, experiencing a change in bump height, and/or experiencing other damage during the thermocompression bonding and subsequent backside processing of the first substrate 12, allowing for better 3DIC integration. This improvement can be observed visually (e.g., SEM) or acoustically (e.g., SAM) as well as through performance improvements, such as decreased device failure. Additionally, the method works with a wide range of pitches, including about 5 µm to about 160 µm, and preferably about 10 µm to about 30 µm.

It will be appreciated that several variations can be made to the foregoing disclosure. For example, in the above embodiments, the solder balls 22 are attached to a pillar or TSV, however, the solder ball can be attached via any conventional attachment point or mechanism, including metal posts, metal pads, and conducting layers. It will be appreciated that the various attachment mechanisms typically require the use of under-bump metal ("UBM").

Another variation can take place during the formation of bonding layer 42. In the illustrated embodiment, bonding layer 42 was formed on the front surface 38 of second substrate 36. Alternatively, bonding layer 42 can instead be formed on conformal layer 32. In this embodiment, second substrate 36 would then be bonded to formed bonding layer 42 following the same bonding processes described above.

Additional advantages of the various embodiments will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present disclosure encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the disclosure. It is to be understood, however, that these examples are provided by way of illustration, and nothing therein should be taken as a limitation upon the overall scope.

Example 1

Figure 5:
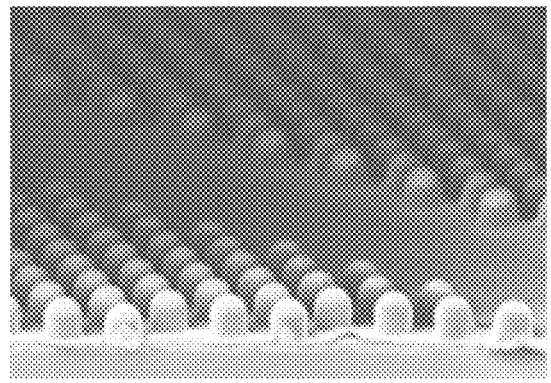
FIG. 5 is a scanning electron microscope ("SEM") image showing the conformal coating of a material on solder balls (Example 1)
Figure 6:
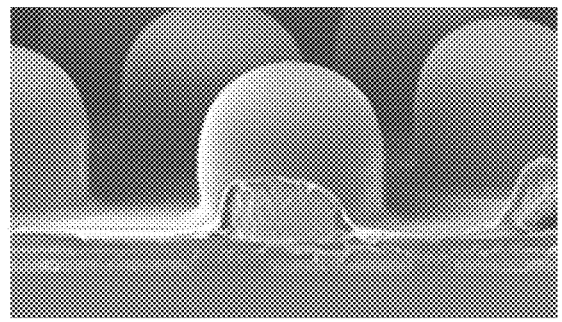
FIG. 6 is an SEM image of a cross section of a test device wafer that shows the thin, conformal protective coating on the solder balls of FIG. 5.

Protective Layer Coating on Device with Lead-Free Solder Balls A 200-mm silicon device wafer was prepared with SnAg solder balls with a bump height of 80 µm and pitch of 160 µm. A high-$T_g$ (greater than 300° C.) thermoplastic composition (BrewerBOND® T1107 material, Brewer Science, Inc., Rolla, MO) was coated conformally to a thickness of approximately 3 µm onto the device wafer with lead-free solder balls by spin coating on a spin coater (obtained from Cost Effective Equipment, LLC, Rolla, MO) at 1,000 rpm with a ramp of 1,000 rpm/s for a time of 45 seconds. The wafer was baked on a hotplate at 60° C. for 1 minute and 220° C. for 4 minutes. After baking, the uniformity of the coat was checked using a scanning electron microscope as shown in FIGS. 5 and 6, which show an example of the previously described embodiment where the TTV of the protective coating is low.

Example 2

Figure 7:
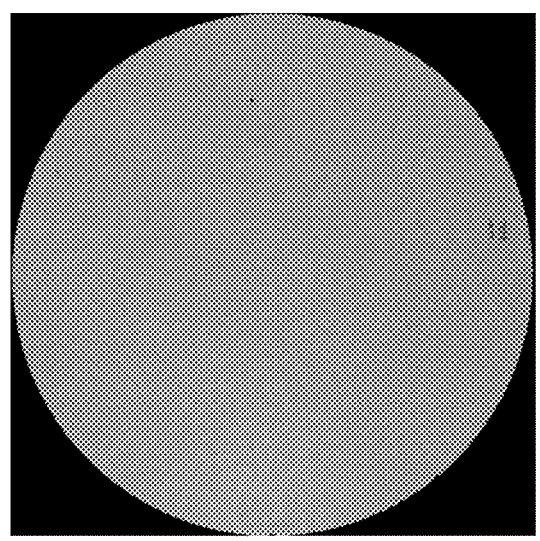
FIG. 7 is a scanning acoustic microscope ("SAM") image of a first bonded wafer pair from Example 2.
Figure 8:
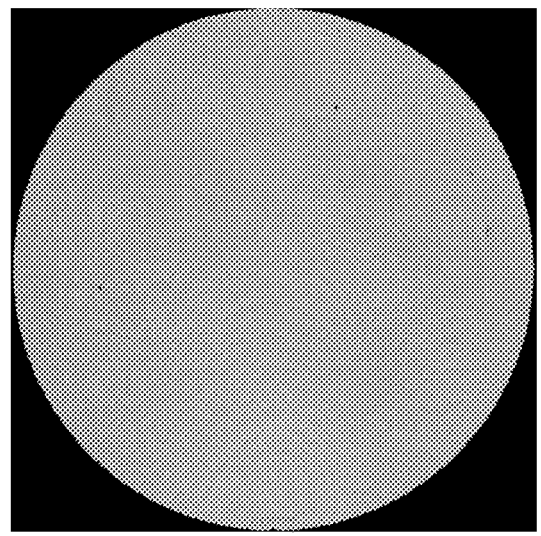
FIG. 8 is an SAM image of a second bonded wafer pair from Example 2.

Bonding Performance Evaluation A thermosetting bonding composition (BrewerBOND® C1301 material, Brewer Science, Inc., Rolla, MO) was coated to approximately 50 µm onto two 200-mm silicon carrier wafers by spin coating on a spin coater-bake plate combination tool (Cee®200CB, Cost Effective Equipment, LLC, Rolla, MO) at 1,000 rpm with a ramp of 3,000 rpm/s for 30 seconds. BrewerBOND® T1107 material was coated to approximately 3 µm onto two other 200-mm silicon carrier wafer by spin coating at 1,000 rpm with a ramp of 500 rpm/s for a time of 90 seconds. One carrier wafer and one device wafer were then bonded together at room temperature and baked on a hot plate at 180° C. for 5 minutes followed by 220° C. for 5 minutes to form a first bonded pair. A second bonded pair was formed following the same steps with the second carrier wafer and second device wafer. After bonding, each bonded pair was checked for voids between the two bonding compositions using a scanning acoustic microscope ("SAM"; obtained from Sonix™, Inc., Springfield, VA) as shown in FIGS. 7 and 8.

Example 3

Grinding, Thermal Evaluation and Mechanical Debonding

Figure 9:
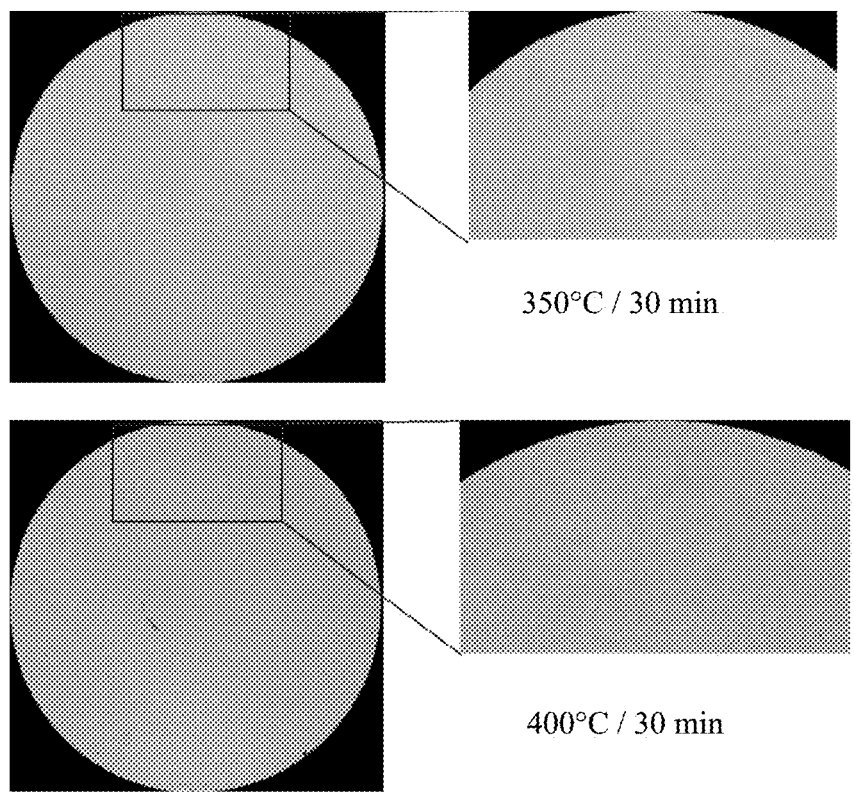
FIG. 9 shows SAM images of a bonded wafer pair after being evaluated for thermal stability for 30 minutes at each of 350° C. and 400° C. (Example 3)

While bonded to the carrier wafers, the simulated device wafers from Example 2 were ground down to 50 µm using an automatic grinder/polisher (DGP8761, available from DISCO, CA). The bonded pair was evaluated for thermal stability by placing them in a processing chamber with a 2.8 mbar vacuum for 30 minutes at 350° C. for one pair and 30 minutes at 400° C. for the other pair. After the thermal evaluation, each bonded pair was checked for voids at the bondline between the two bonding compositions using a scanning acoustic microscope (see FIG. 9).

Example 4

Thermocompression Bonding of Thinned Silicon Bonded Pair A simulated silicon device and silicon carrier wafer were coated and bonded with the materials and process as described in Example 2. The combined thickness of the two-layer bonding system was 52 µm. The simulated device wafer was then thinned to a thickness of 50 µm as described in Example 3. Dummy silicon dies (5 mm×5 mm) were placed on the side of the thinned device wafer remote from the carrier wafer using thermocompression bonding ("TCB"). The placement force for each die ranged from 5 KgF to 14.5 KgF for 6 seconds as shown in Table 1. In this Example 4, no bonding material was used on the dies. Thus, the dies could be removed for post-bond inspection of the thinned wafer. Additionally, the TCB process could be repeated multiple times in the same location to simulate multi-die stacking at the same position. Therefore, the stress and thermal impact on the thinned wafer following one to eight TCB cycles could be evaluated.

TABLE 1

Experiment design for nine different die placement conditions.

| Leg | Force (KgF) | Time (Sec) | Bottom Chuck Temp (° C.) | Bond Head Temp (° C.) | Replications of TCB Cycle |
|---|---|---|---|---|---|
| 1 | 5 | 6 | 30 | 280 | 1× |
| 2 | 10 | 6 | 30 | 280 | 1× |
| 3 | 14.5 | 6 | 30 | 280 | 1× |
| 4 | 5 | 6 | 80 | 280 | 1× |
| 5 | 10 | 6 | 80 | 280 | 1× |
| 6 | 14.5 | 6 | 80 | 280 | 1× |
| 7 | 5 | 6 | 80 | 280 | 8× |
| 8 | 10 | 6 | 80 | 280 | 8× |
| 9 | 14.5 | 6 | 80 | 280 | 8× |

Figure 10A:
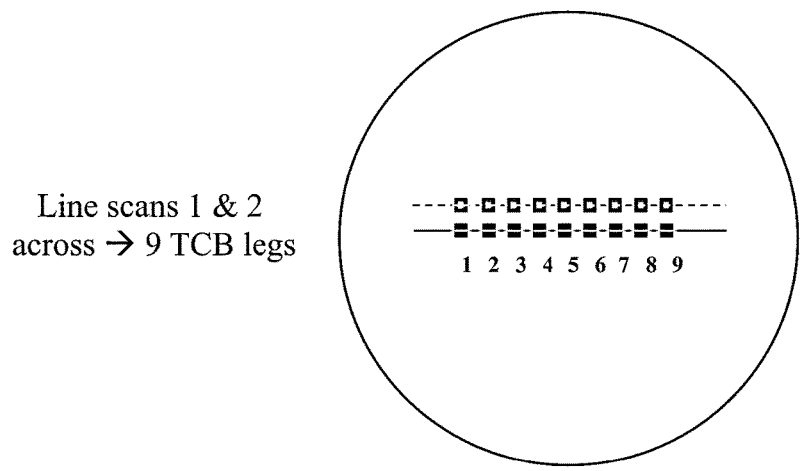
FIG. 10(A) shows the scanning pattern followed to evaluate surface planarization, as described in Example 4.
Figure 10B:
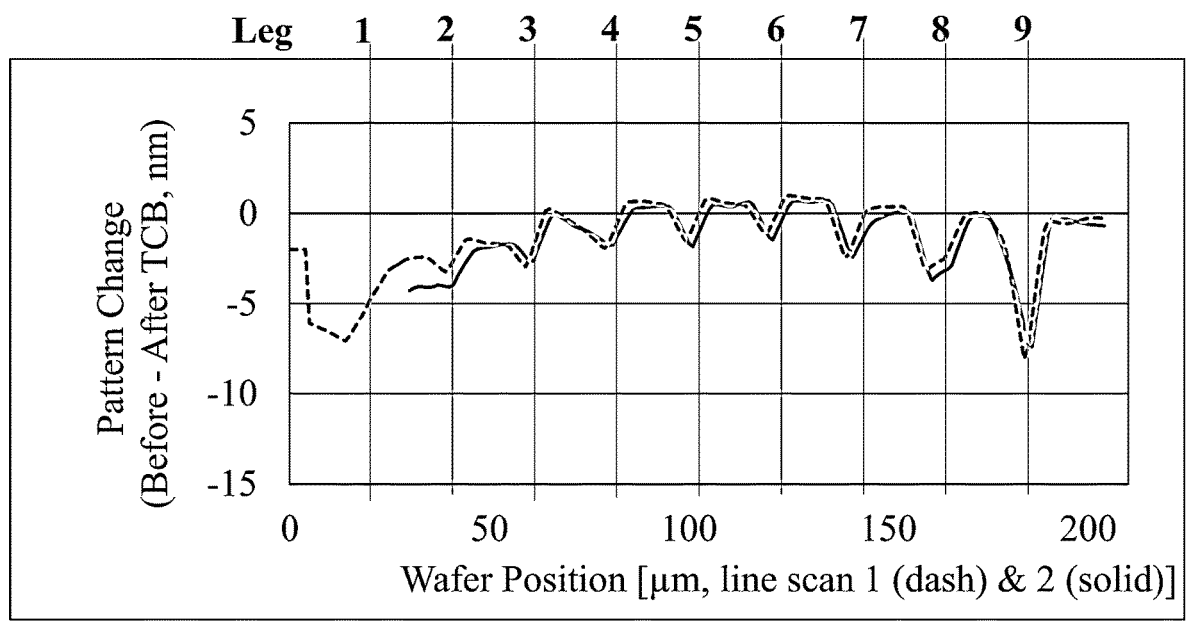
FIG. 10(B) is a graph depicting the surface planarization after thermocompression bonding by profilometry, as described in Example 4.

The first measurements taken after TCB on the thinned silicon wafer involved a surface planarity analysis. FIG. 10(A) shows a line scan pattern across the surface of the thinned silicon measured by a KLA-Tencor Wafersight™ Pattern Wafer Geometry system, while FIG. 10(B) shows the corresponding graph. The position of the line scan was such that it followed different TCB placement conditions as defined by the DOE in Table 1. The results indicate that at the most extreme TCB condition of 14.5 KgF for 6 seconds repeated eight times (8×) in the same position, the maximum permanent deformation created was less than 10 nm. Hence, the 50-μm silicon landing wafer is not only supported by the two temporary bonding materials but also does not cause any permanent damage to the device surface. Thus, minimal impact on the placement or leveling of adjacent chips attached to the substrate is expected.

Next, the impact of TCB on a thinned silicon wafer was measured by tracking the temporary z-axis deformation as an indication of bondline compression during a TCB cycle. In other words, an experiment was conducted to determine the magnitude of silicon deformation in real time. In this experiment, a reference (similar to a control) was created for comparison purposes. The reference was a silicon wafer that had not been treated, bonded with another wafer, or modified in any other way. Two thermoplastic materials were tested: TBM1, which was a lower-$T_g$ (less than 80° C.) material containing a cyclic olefin polymer; and TBM2, which was a higher-$T_g$ (greater than 220° C.) material containing a polyethersulfone.

Figure 11A:
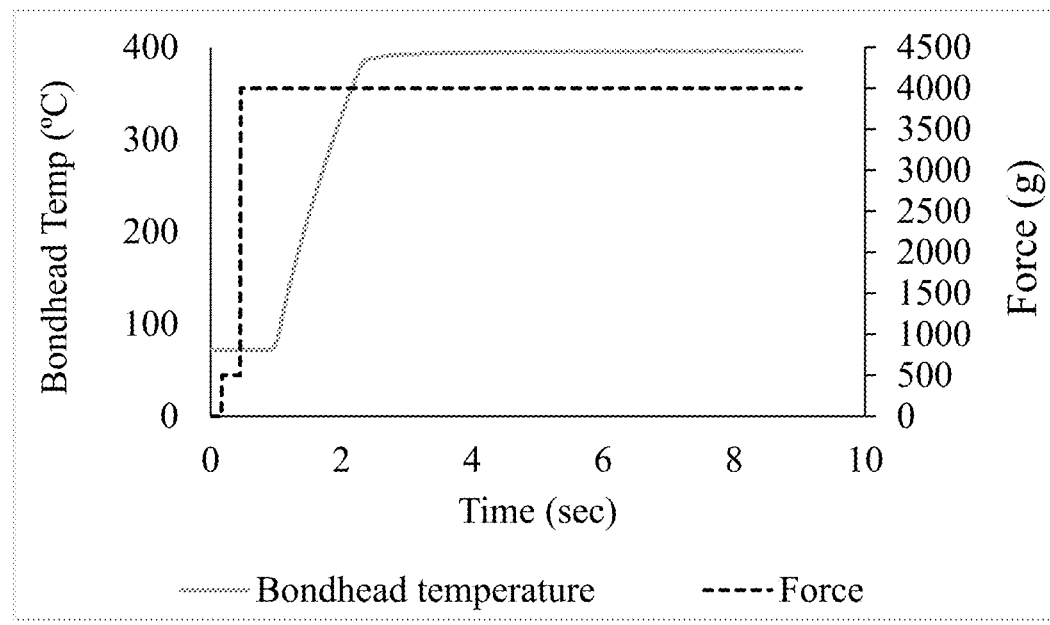
FIG. 11(A) is a graph of bondhead temperature and force vs. time during thermocompression bonding with high- and low-$T_g$ temporary bonding materials (Example 4)
Figure 11B:
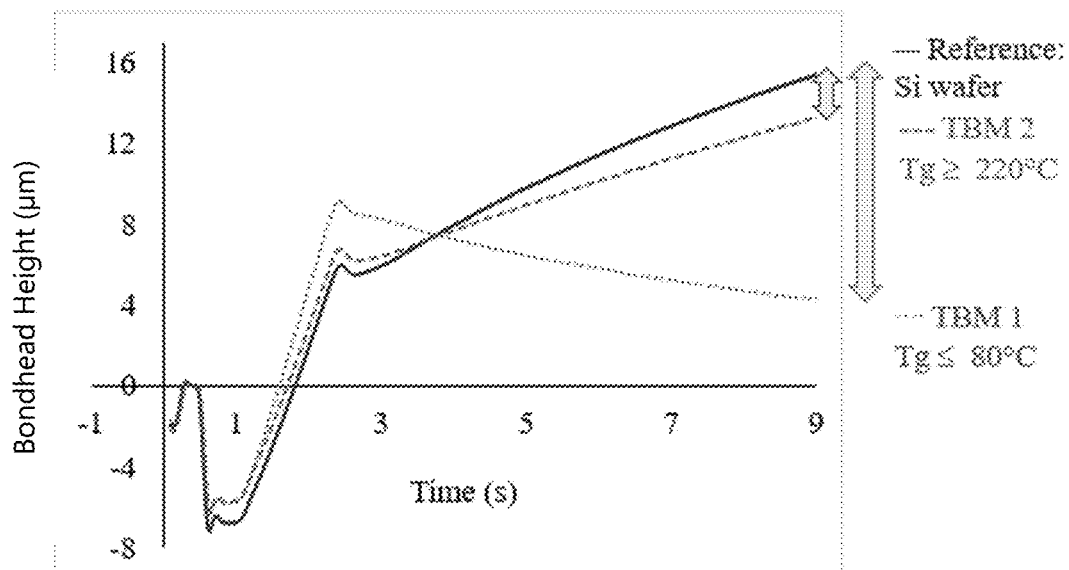
FIG. 11(B), which should be viewed in conjunction with FIG. 11(A), provides a graph that compares the bondhead height during thermocompression bonding with high- and low-$T_g$ temporary bonding materials (Example 4)

FIG. 11(A) shows the TCB conditions Force and Temperature vs. Time for the experiment. FIG. 11(B) shows the resulting Bondhead Position vs. Time for the TCB process performed on thinned silicon supported by bonding materials having different glass transition temperatures (i.e., TBM1 & TBM2). It can be seen that the Z-height position of the reference increased over the 9-second cycle due to thermal expansion. The Z-height position of the lower-$T_g$ material (TBM1) decreased over the TCB cycle due to softening of the underlying material. Finally, the Z-height position of the high-$T_g$ material (TBM2) followed the reference closely, indicating that it offered better thinned silicon support than the lower-$T_g$ material. This comparison showed that the smallest temporary deformation was observed with thermoplastic materials having a $T_g$ higher than the bond temperature. Thus, it was demonstrated that a higher $T_g$ material is a necessary property for bond materials to support a thinned device wafer having solder bumps embedded in the bond line. This will avoid stress and damage to the underlying solder bumps during TCB processing.

Figure 12A:
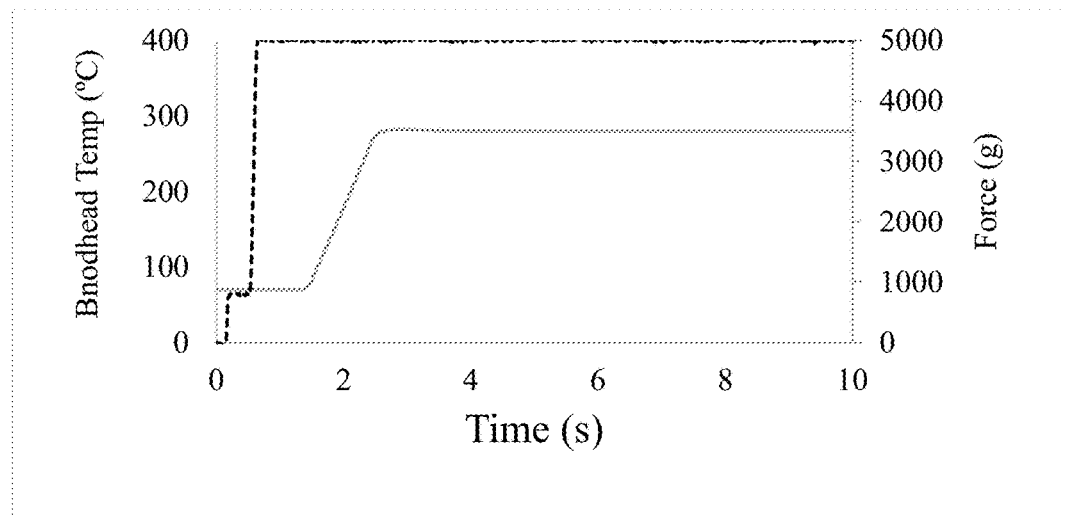
FIG. 12(A) is a graph of bondhead temperature and force vs. time during thermocompression bonding with a dual-layer system (Example 4)
Figure 12B:
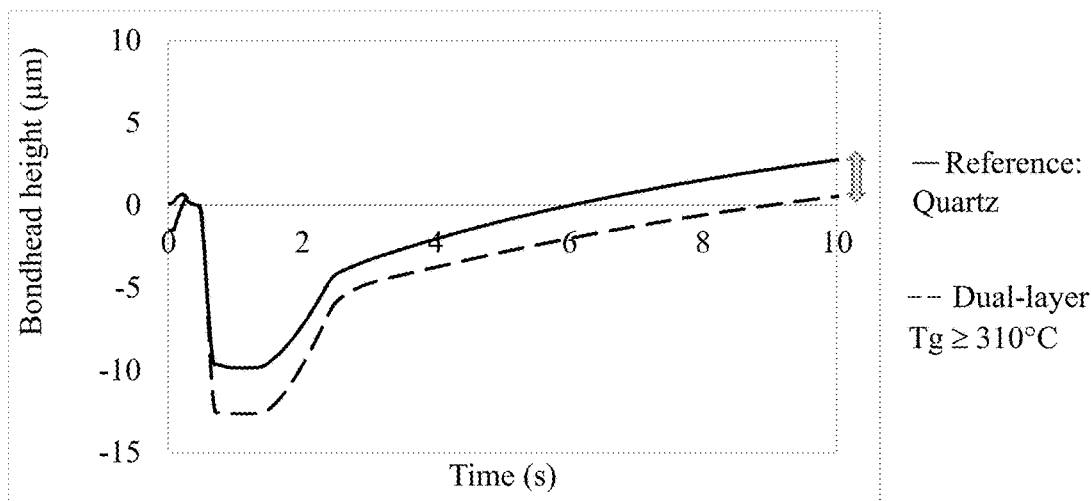
FIG. 12(B), which should be viewed in conjunction with FIG. 12(A), is a graph that compares the bond-head height during thermocompression bonding with a dual-layer system (Example 4)

As a further confirmation of this conclusion, the same experiment was repeated with a dual layer system this time (i.e., the BrewerBOND® T1107, and BrewerBOND® C1301 materials together) supporting the thinned silicon. The reference or control was switched to a quartz wafer that had not been treated, bonded with another wafer, or modified in any other way. FIG. 12(A) shows the TCB conditions Force and Temperature vs. Time for the experiment, and FIG. 12(B) shows the resulting Bondhead Position vs. Time for the TCB process. The outcome for the Dual-Layer System shows a matching slope between the reference and the dual-layer system under 5 KgF bonding force at 280° C. for 12 seconds. The maximum 2.5 μm temporary deformation (i.e., Z-height difference) during the TCB process could be due to the fundamental compressibility of the quartz substrate and temporary bonding materials. However, it is believed that the parallel response after 0.5 second implies little-to-no permanent deformation between the reference and the simulated dual-layer system bond. The parallel response could also indicate the degree of compressibility of the temporary bonding materials due to the constant force applied. Regardless, this degree of deformation is expected to be sufficient to protect embedded solder bumps or balls, their shape, and their electrical integrity for the device wafer.

Example 5

Testing Wafers with Copper Pillars

Figure 13:
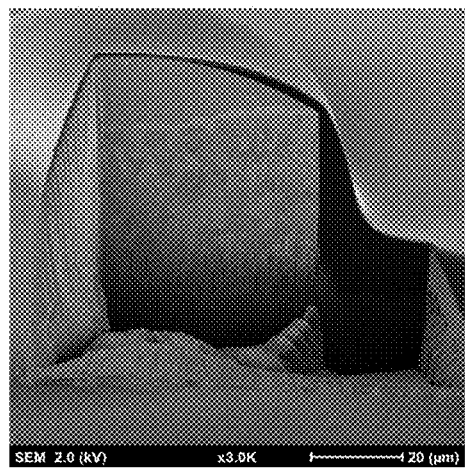
FIG. 13 is an SEM image showing a thermoplastic bonding material coated on copper pillars with solder cap before bonding, thermocompression bonding, debonding, and cleaning (Example 5)

A device wafer with 45-μm copper pillars, 15-μm SnAg solder caps, and 200-μm pitch was coated with an experimental version of BrewerBOND® T1107 thermoplastic bonding material with higher polymer solids and different solvent ratio (available from Brewer Science, Rolla, MO) having a $T_g$ of 320° C. The thermoplastic bonding material was used to coat devices that have a steeper geometry. The thermoplastic bonding material was coated with a Cee® spin coater for a 5-μm conformal coat at 1,250 rpm, 1,000 rpm/s ramp, for 30 seconds. The coated device wafer was then baked on hotplates at 120° C. for 5 minutes followed by 220° C. for 5 minutes. The coated copper pillars with solder caps were imaged by a scanning electron microscope as shown in FIG. 13, which depicts the embodiment described previously where the protective coating is conformal (i.e., not planarizing) but its TTV is much more relaxed (i.e., the thickness between features/structures is much greater (about 10×) than the coating thickness on the tops or sides of those features/structures.

Four-inch glass carrier wafers were coated with BrewerBOND® C1301-120 material by spin coating the material with a Cee® spinner at 800 rpm, 500 rpm/s ramp, for 90 seconds giving about a 100-μm thick coat.

Figure 14:
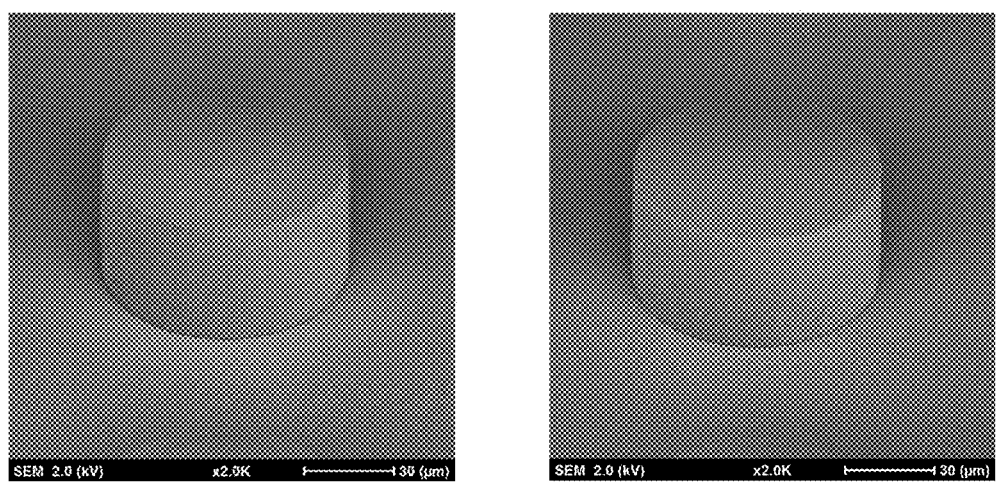
FIG. 14 provides SEM images showing a thermoplastic bonding material coated on copper pillars with solder cap after bonding, thermocompression bonding, debonding, and cleaning, with slight damage (left) and no damage (right) as described in Example 5.
Figure 15:
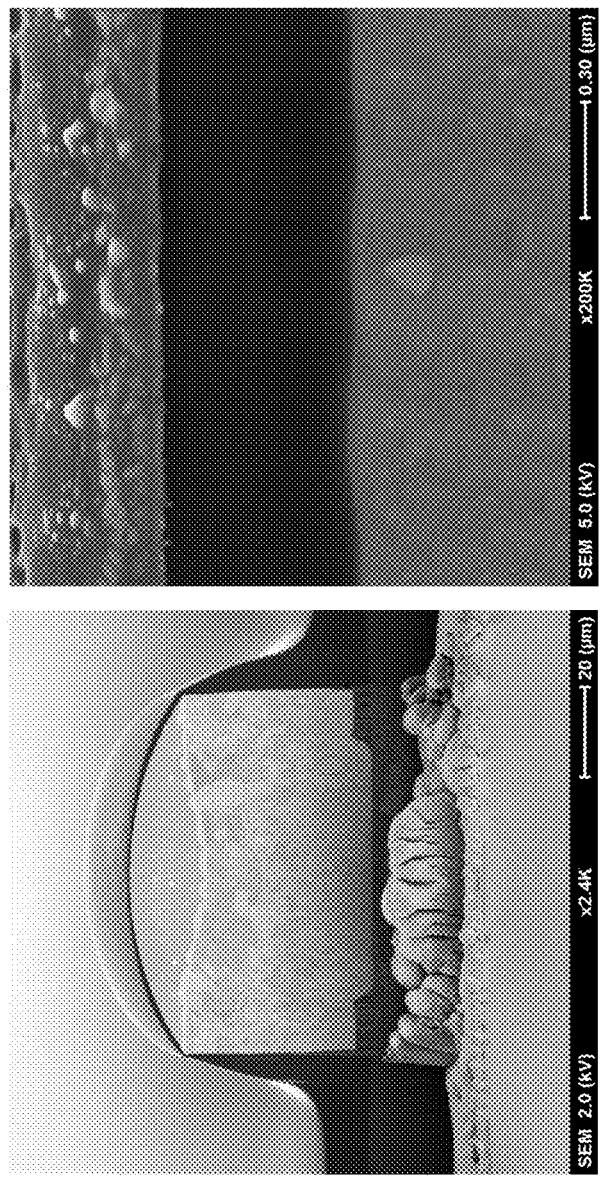
FIG. 15 provides SEM images showing a thermoplastic protective material coated on copper pillars after coating (left) and the top coating of a second thermoplastic bonding material on a solder cap (right) as described in Example 5.

These device and carrier wafers were bonded in a bonder (Apogee™, Bonder, available from Cost Effective Equipment, LLC, Rolla, MO) at 25° C., 0 Newtons, for 3 minutes. The bonded stack was then thermally cured at 180° C. for 5 minutes and 220° C. for 5 minutes. Once the bonded stack was cured, the stack was put back into the bonder for a thermal compression bonding simulation. The top platen of the bonder was set to 300° C., and the bottom platen was set to 100° C. The bonded stack was placed on the bottom platen with the glass wafer touching the bottom platen. The bonded stack was then compressed using a force of 1,650 N for 15 seconds. The bonded stack was then debonded, and the device wafer was cleaned to remove all the thermoplastic bonding material. The separated and cleaned device wafer was imaged by a scanning electron microscope as shown in FIG. 14. FIG. 15 shows another sample from this same set of testing, with the left side showing the coating on the copper pillars, and the right side showing the presence of the thermoplastic bonding layer. This Example 5 further demonstrates that the materials effectively mitigate any damage to the SnAg solder caps during processing.

We claim:

1. A temporary method comprising:
   providing a stack comprising:
   a first substrate having a back surface and a front surface, said front surface comprising a solder ball;
   a conformal layer of a composition on said front surface and said solder ball;
   a second substrate having a first surface; and
   a bonding layer on said first surface without any intermediate layers between the bonding layer and the first surface of the second substrate, said bonding layer being in contact with said conformal layer; and
   separating said first and second substrates.

2. The method of claim 1, wherein said composition is a thermoplastic composition.

3. The method of claim 1, wherein said conformal layer has an average thickness of about 0.1 µm to about 20 µm.

4. The method of claim 1, wherein said solder ball comprises one or more of Sn, Ag, Ni, Cu, Ti, W, Au, Pb, Bi, Zn, Cd, or In.

5. The method of claim 1, wherein said solder ball is connected to said front surface via an attachment point.

6. The method of claim 5, wherein said attachment point is chosen from pillars, posts, pads, through-silicon vias, or conductive layers.

7. The method of claim 1, wherein said front surface comprises a plurality of solder balls.

8. The method of claim 7, wherein:
   said front surface presents areas that are free of solder balls;
   said solder balls comprise respective outer surfaces; and
   said conformal layer conformally coats said areas that are free of solder balls and conformally coats said respective outer surfaces.

9. The method of claim 1, wherein said providing comprises forming said conformal layer on said front surface and solder ball and then bonding said bonding layer to said conformal layer.

10. The method of claim 9, wherein said bonding comprises pressing said first and second substrates together under heat and pressure so that said bonding layer and conformal layer adhere to one another.

11. The method of claim 10, wherein said heat is a temperature of from about 25° C. to about 200° C. and said pressure is from about 1 N to about 5,000 N, wherein said pressing together under heat and pressure is carried out for a time period of from about 10 seconds to about 10 minutes.

12. The method of claim 9, where said solder balls do not experience deformation or shifting during said bonding.

13. The method of claim 1, wherein said first substrate comprises one of the following:
   one or more chips;
   one or more chiplets; or
   a device wafer.

14. The method of claim 1, wherein said composition comprises one or more of:
   polymers or oligomers chosen from cyclic olefins, epoxies, siloxanes, or mixtures thereof; or
   polymers chosen from one or more of polyamides, polyimides, polysulfones, polyethersulfones, polyolefins, polyamide esters, polyimide esters, polyetheretherketones, polyetherimides, or mixtures thereof.

15. The method of claim 1, where said conformal layer has a glass transition temperature of at least about 200° C.

16. The method of claim 1, further comprising, prior to separating said first and second substrates, subjecting said stack to processing chosen from one or more of back-grinding, chemical-mechanical polishing, etching, metallizing, dielectric deposition, patterning, passivation, annealing, or redistribution layer formation.

17. The method of claim 1, further comprising, prior to separating said first and second substrates:
   (a) thinning the back surface of said first substrate to form a thinned back surface;
   (b) bonding a first chip or first chiplet to said thinned back surface;
   (c) optionally bonding a second chip or second chiplet to said first chip or first chiplet; and
   (d) optionally repeating (c) one or more times to create a stacked structure.

18. A microelectronic structure comprising:
   a first substrate having a back surface and a front surface, said front surface comprising a solder ball;
   a conformal layer of a thermoplastic composition on said front surface and said solder ball;
   a bonding layer in contact with said conformal layer; and
   a second substrate having a first surface, said bonding layer being adjacent said first surface.

19. The structure of claim 18, wherein said conformal layer has an average thickness of about 0.1 µm to about 20 µm.

20. The structure of claim 18, where said conformal layer has a glass transition temperature of at least about 200° C.

21. The structure of claim 18, wherein said solder ball comprises one or more of Sn, Ag, Ni, Cu, Ti, W, Au, Pb, Bi, Zn, Cd, or In.

22. The structure of claim 18, wherein said solder ball is connected to said front surface via an attachment point.

23. The structure of claim 22, wherein said attachment point is chosen from pillars, posts, pads, through-silicon vias, or conductive layers.

24. The structure of claim 18, wherein said front surface comprises a plurality of solder balls.

25. The structure of claim 24, wherein:
   said front surface presents areas that are free of solder balls;
   said solder balls comprise respective outer surfaces; and
   said conformal layer conformally coats said areas that are free of solder balls and conformally coat said respective outer surfaces.

26. The structure of claim 18, wherein said first substrate comprises one of the following:
   one or more chips;
   one or more chiplets; or
   a device wafer.

27. The structure of claim 18, further comprising:
   (a) a first chip or first chiplet on said back surface of said first substrate;
   (b) optionally a second chip or second chiplet on said first chip or first chiplet; and
   (c) optionally one or more further chips or chiplets sequentially stacked on one another to create a stacked structure.

28. A bonding method comprising:
   forming a conformal layer of a thermoplastic composition on a front surface of a first substrate to form a conformally coated first substrate, said front surface comprising a solder ball; and
   bonding said conformally coated first substrate to a second substrate having a first surface with a bonding layer on said first surface, said bonding comprising contacting said bonding layer and said conformal layer.

29. The method of claim 28, wherein said conformal layer has an average thickness of about 0.1 μm to about 20 μm.

30. The method of claim 28, wherein said solder ball comprises one or more of Sn, Ag, Ni, Cu, Ti, W, Au, Pb, Bi, Zn, Cd, or In.

31. The method of claim 28, wherein said solder ball is connected to said front surface via an attachment point.

32. The method of claim 31, wherein said attachment point is chosen from pillars, posts, pads, through-silicon vias, or conductive layers.

33. The method of claim 28, wherein said front surface comprises a plurality of solder balls.

34. The method of claim 33, wherein:
said front surface presents areas that are free of solder balls;
said solder balls comprise respective outer surfaces; and
said conformal layer conformally coats said areas that are free of solder balls and conformally coats said respective outer surfaces.

35. The method of claim 28, wherein said bonding comprises pressing said first and second substrates together under heat and pressure so that said bonding layer and conformal layer adhere to one another.

36. The method of claim 35, wherein said heat is a temperature of from about 25° C. to about 200° C. and said pressure is from about 1 N to about 5,000 N, wherein said pressing together under heat and pressure is carried out for a time period of from about 10 seconds to about 10 minutes.

37. The method of claim 28, where said solder balls do not experience deformation or shifting during said bonding.

38. The method of claim 28, wherein said first substrate comprises one of the following:
one or more chips;
one or more chiplets; or
a device wafer.

39. The method of claim 28, wherein said composition comprises one or more of:
polymers or oligomers chosen from cyclic olefins, epoxies, siloxanes, or mixtures thereof; or
polymers chosen from one or more of polyamides, polyimides, polysulfones, polyethersulfones, polyolefins, polyamide esters, polyimide esters, polyetheretherketones, polyetherimides, or mixtures thereof.

40. The method of claim 28, where said conformal layer has a glass transition temperature of at least about 200° C.

* * * * *